(12) United States Patent
Zinsstag et al.

(10) Patent No.: US 9,218,936 B2
(45) Date of Patent: Dec. 22, 2015

(54) DEFLECTING DEVICE FOR ELECTRON BEAMS, MAGNETIC DEFLECTING UNIT FOR SUCH A DEFLECTING DEVICE, AND DEVICE FOR VAPOR COATING A PLANAR SUBSTRATE USING SUCH A DEFLECTING DEVICE

(75) Inventors: Juergen Zinsstag, Stuttgart (DE); Cristian Jans, Wernau (DE)

(73) Assignee: Ferrotec Europe GmbH, Unterensingen (DE)

( * ) Notice: Subject to any disclaimer, the term of this patent is extended or adjusted under 35 U.S.C. 154(b) by 856 days.

(21) Appl. No.: 13/514,230

(22) PCT Filed: Dec. 10, 2010

(86) PCT No.: PCT/DE2010/001437
§ 371 (c)(1),
(2), (4) Date: Aug. 14, 2012

(87) PCT Pub. No.: WO2011/069493
PCT Pub. Date: Jun. 16, 2011

(65) Prior Publication Data
US 2012/0298041 A1    Nov. 29, 2012

(30) Foreign Application Priority Data
Dec. 10, 2009    (DE) .......................... 10 2009 057 486

(51) Int. Cl.
*H01J 3/32*    (2006.01)
*H01J 37/147*    (2006.01)
(Continued)

(52) U.S. Cl.
CPC .............. *H01J 37/1475* (2013.01); *C23C 14/30* (2013.01); *C23C 14/542* (2013.01);
(Continued)

(58) Field of Classification Search
CPC .............. H01J 37/1475; H01J 37/1472; H01J 37/3053; H01J 2237/3132; H01J 2237/1523; H01J 37/305; H01J 37/147; C23C 14/30; C23C 14/542
USPC .......................... 250/396 R; 118/723 EB, 726
See application file for complete search history.

(56) References Cited

U.S. PATENT DOCUMENTS 3,046,936 A    7/1962    Simons, Jr.
3,432,335 A    3/1969    Schiller et al.
(Continued)

FOREIGN PATENT DOCUMENTS

DE    64 635 A1    11/1968
DE    237 526 A1    7/1986
(Continued)

OTHER PUBLICATIONS

Kienle, M, et al.: "Simulation of an Aberration-Compensated Parallel Beam Shift for Fast Electron-Beam Welding", Nuclear Instruments and Methods in Physics Research A247, 1999, pp. 282-287.
(Continued)

*Primary Examiner* — Michael Maskell
(74) *Attorney, Agent, or Firm* — Crowell & Moring LLP

(57) ABSTRACT

A vaporizing device is provided, wherein an elongated pot having material to be vaporized is impinged upon by an electron beam, preferably via several electron guns. Each electron gun is responsible for a certain section of the pot. The electron beam is guided over the melt in a pendular manner. For this purpose, a first magnetic deflecting unit is provided, which produces a variable parallel displacement of the electron beam. In order to achieve this, two magnetic fields are provided, the magnetic field boundaries of which form a type of lens system, wherein the outlet side of the first magnetic field is convex and the inlet side of the second magnetic field is concave. In order to deflect the electron beam into the pot, a second magnetic deflecting unit is provided, the magnetic field of which can be moved synchronously with the beam displacement parallel to the pot.

7 Claims, 3 Drawing Sheets

(51) Int. Cl.
   *C23C 14/30*     (2006.01)
   *C23C 14/54*     (2006.01)
   *H01J 37/305*    (2006.01)

(52) U.S. Cl.
   CPC ........ *H01J 37/1472* (2013.01); *H01J 37/3053* (2013.01); *H01J 2237/1523* (2013.01); *H01J 2237/3132* (2013.01)

(56) References Cited

U.S. PATENT DOCUMENTS

| | | | |
|---|---|---|---|
| 3,896,258 A | | 7/1975 | Hanks |
| 4,524,717 A | * | 6/1985 | Neumann et al. ............ 118/718 |
| 4,724,796 A | | 2/1988 | Ranke et al. |
| 4,778,974 A | * | 10/1988 | Neumann et al. ........ 219/121.15 |
| 5,393,984 A | | 2/1995 | Glavish |
| 6,774,372 B1 | | 8/2004 | Rose et al. |
| 2002/0084422 A1 | | 7/2002 | Kienzle et al. |
| 2005/0017202 A1 | | 1/2005 | White |
| 2007/0170369 A1 | | 7/2007 | Purser et al. |

FOREIGN PATENT DOCUMENTS

| | | |
|---|---|---|
| DE | 35 13 546 A1 | 10/1986 |
| DE | 36 39 683 A1 | 5/1988 |
| DE | 39 21 040 A1 | 1/1991 |
| DE | 199 44 857 A1 | 3/2001 |
| EP | 1 187 169 A2 | 3/2002 |

OTHER PUBLICATIONS

German Search Report dated May 12, 2010 with Partial English translation (nine (9) pages).

International Preliminary Report on Patentability, ( Forms PCT/IB/338, PCT/IB/373, and PCT/ISA/237) dated Jun. 21, 2012 (five (5) pages).

International Search Report dated Apr. 28, 2011 with English translation (six (6) pages).

\* cited by examiner

DEFLECTING DEVICE FOR ELECTRON BEAMS, MAGNETIC DEFLECTING UNIT FOR SUCH A DEFLECTING DEVICE, AND DEVICE FOR VAPOR COATING A PLANAR SUBSTRATE USING SUCH A DEFLECTING DEVICE

BACKGROUND AND SUMMARY OF THE INVENTION

The invention relates to a deflecting device for electron beams, in particular for use in an electron beam vaporizer with a first magnetic deflecting unit having a central axis, where through the agency of said deflecting unit an electron beam entering the deflecting unit on the central axis experiences, due to a magnetic field system, a displacement parallel to the central axis in a displacement plane, where the intensity of the magnetic field system of the magnetic deflecting unit can be varied in order to determine the magnitude of the beam displacement, and with a second magnetic deflecting unit to steer the electron beam exiting the first magnetic deflecting unit out of the displacement plane.

A deflecting device of this type is described in connection with a vaporization system in DE 35 13 546 A1. The vaporization system comprises an elongated pot wherein it is achieved by means of varying beam displacement that the electron beam is traversed pendularly over longitudinal sections of the pot. Since the beam displacement is limited, in given cases several electron beam vaporizers, each with such a deflecting device, are provided next to one another in order to cover the entire length of the pot. Since the spatial exigencies of a vaporization system frequently do not permit guiding the electron beam directly into the pot, the displacement plane in which the beam displacement occurs is disposed above the pot and the electron beam is deflected directly above the pot from the displacement plane into the pot, i.e. onto the surface of the melt present there.

For this, a magnetic field is stretched along the pot, where the field lines of the magnetic field run parallel to the pot. So that the deflection occurs continuously in the same manner over the entire length of the pot the field must be made sufficiently homogeneous. However, it is difficult to realize such a homogeneous field by means of widely spaced armature plates of an electromagnet.

Furthermore, it should be possible to dispose the electron beam vaporizer under the passing substrates, where the high voltage used should not exceed 10 kV in order to avoid X-radiation.

The invention is therefore based on the object of providing a (second) deflecting unit in which the deflection from a displacement plane occurs, in so far as possible, in the same manner over the entire length of the pot.

To solve the problem the invention provides that the second magnetic deflecting unit generates a magnetic field running transverse to the central axis, the homogeneous area of said magnetic field being shorter than the maximum displacement which is to be achieved with the first deflecting unit, where the position of said magnetic field transverse to the central axis can be varied synchronously with the beam displacement.

A magnetic field whose length can be varied can be realized in that a plurality of air core coils is provided which are disposed next to one another on one axis. The individual air core coils are to be energized with current independently of one another so that on successive energizing of the coils with current the magnetic field moves from air core coil to air core coil.

However, a magnetic field generated by air core coils is not sufficiently intense to deflect the electron beam in the desired manner. On account of this a magnetic core is provided which is held displaceably on the axis. The magnetic core has approximately the length of one air core coil. It extends along the respective coil energized with current and in a known manner amplifies the magnetic field found therein.

Therefore, there is a sufficiently intense magnetic field in the area of the core, where this amplified field is spatially bounded. Since the air core coils are constructed identically, a magnetic field of the same type can therefore be established for deflecting an electron beam at any point in the air core coil system.

In the simplest case the coils are disposed next to one another on a guide tube and the core is guided within the guide tube, where its diameter corresponds approximately to the inner diameter of the guide tube. The core is preferably lubricated with a magnetic liquid.

Preferably, the guide tube is embodied with slots to avoid eddy currents in the longitudinal direction.

The air core coils are then each energized with current in mutually exclusive intervals of time or in given cases overlapping intervals of time, where the curve of the intensity of the current has a rising and falling shape, e.g. a saw-tooth or bell shape, so that it is always the case that a maximum current is supplied at least to precisely that air core coil over which the electron beam is presently located. If due to the control of the first deflecting unit the electron beam moves further in the longitudinal direction of the pot to the next air core coil, then with a corresponding control a magnetic field is generated in that air core coil so that the electron beam once again finds itself in a magnetic field which deflects it into the pot. The iron core follows the magnetic field moving through the air core coils and ensures in each case the necessary field intensity for redeflecting the electron beam. Thus it is achieved that the electron beam in the longitudinal direction of the pot can be wobbled back and forth over the melt and always strikes the material to be vaporized at the same angle of incidence.

The invention has the effect that through the synchronization of the first and second deflecting units the dwell times on the vaporant material and therefore the uniformity of coating is adjustable. Furthermore, the adjustment of the intensity of the magnetic field of the air core coils also permits a wobbling of the electron beam transverse to the longitudinal axis of the pot, whereby it is also possible to vaporize optical materials which sublimate in part.

The magnetic field system of the first deflecting unit, which causes the beam displacement, comprises preferably two tandemly disposed and antiparallelly aligned magnetic fields. Perpendicular to the magnetic field lines runs the displacement plane. Such devices are known per se. The electron beam enters the first magnetic field, in the displacement plane on the central axis lying in the displacement plane, and is, depending on the intensity of the magnetic field, deflected in the displacement plane by an angle to the left or to the right.

Since the second magnetic field runs antiparallel to the first magnetic field, the electron beam is steered back therein by the same angle so that all in all a parallel displacement of the electron beam is effected. Therefore a pendular displacement of the electron beam can be achieved, e.g. by a sinusoidal change of the excitation current of the electromagnets which generate the respective fields.

Customarily the magnetic fields in their projection onto the displacement plane are shaped rectangularly because this can be achieved by relatively simple, namely rectangularly shaped, armature plates for the electromagnets. The area of homogeneously running field lines is thus bounded by a rectangularly running magnetic field boundary. The disadvantage therein is that the electron beam exits the first magnetic field obliquely to the magnetic field boundary and likewise enters the second magnetic field obliquely. Thus scattering effects occur which expand the electron beam. It is thus proposed according to the invention that the magnetic field boundary of the first magnetic field has a convex contour on the exit side and the magnetic field boundary of the second magnetic field has a concave contour on the entry side.

The contour is chosen in so far as possible so that the electron beam at each point at which it exits the first magnetic field or enters the second magnetic field runs perpendicularly through the tangent at the magnetic field boundary. Scattering effects are avoided thereby so that the electron beam is expanded only slightly or not at all.

Such a magnetic deflecting unit which produces a beam displacement has magnetic fields that are each formed from two parallel-running armature plates of an electromagnet. In order to achieve the above-described contour of the magnetic field boundaries, the opposite edges of the armature plates have edges running parallel but curved.

The subject of the invention is also a device for vaporizing a planar substrate, e.g. a foil, with a thin material layer, in which the substrate is guided over an elongated pot so that the substrate is vaporized in each case over its width.

The coating of large-surface substrates, such as architectural glass, foils, etc. is done in general in so-called pass-through systems in which material is applied onto the substrate by a sputter process. The sputter sources are positioned under the substrates passing through as linear sources so that the substrates passing through can be coated from below. If, however, the coating is done using a commercial electron beam vaporizer with 270° beam deflection and in order to achieve better coating rates, then uniform coatings are, due to the geometry of the system, only to be achieved with great difficulty since for large substrate widths several electron beam vaporizers disposed next to one another must be used. Since these only strike the material pointwise, several apertures below the substrates and a large substrate spacing are necessary in order to achieve a uniform layer thickness distribution on the substrates. Because of the days-long operational period of such pass-through systems these apertures are vaporized so heavily that replacement of the apertures and therefore an interruption of the process would be necessary after a few hours. Thus previously known conventional electron beam vaporizers do not come into use for this application. In fact, commercial electron beam vaporizers are on the market which are directed obliquely from above onto the material to be vaporized. However, these electron beam vaporizers have the disadvantage that they are not suitable for pass-through systems since the electron beam gun would have to be disposed above the pot and therefore would be coated itself.

The material vaporization is done using an electron beam gun.

In order to obtain a compactly built device in which the material vaporization is done using an electron beam gun, the gun must be disposed below the transport path for the substrate and directed onto it. Disposition below the pot is still possible in given cases. For this a third deflecting unit deflects the electron beam directed onto the substrate approximately parallel to the transport path. Within this section of the electron beam, said section running parallel to the transport path, the above-described first deflecting unit is located in order to produce a varying beam displacement. Thereafter the electron beam is deflected into the pot using the third deflecting unit so that the electron beam strikes the melt surface perpendicularly in so far as possible.

The third deflecting unit can, as described above, comprise an axial sequence of air core coils in which a magnetic core can run back and forth. One air core coil row can be provided, preferably in the beam direction as seen from the pot, but also two or more air core coil rows can be provided, which preferably are disposed in front of and/or behind the pot. With such a double disposition of air core coil rows it can be achieved by a suitable control of the air core coils that the electron beam is wobbled in the beam direction, therefore not only longitudinally relative to the pot but rather is also deflected transversely relative thereto so that even for a wide pot the entire surface is traversed successively by the electron beam.

With the first deflecting unit, as already explained, a parallel displacement is produced so that the electron beam runs continuously perpendicular to the longitudinal extension of the pot. Since due to the explained shape of the second deflecting unit in the present area of the beam entry into the pot zone a sufficiently intense and consistently uniform magnetic field is generated, each electron beam is deflected into the pot in the same manner independently of its position in relation to the longitudinal extension of the pot. Therefore, a deflecting system is provided which is highly precise and enables uniform vaporization rates over the length of the pot.

BRIEF DESCRIPTION OF THE DRAWINGS

In the following the invention will be explained in more detail with the aid of an embodiment example. In reference thereto

FIG. 2b is a side view of the magnetic deflecting unit according to FIG. 2a;

DETAILED DESCRIPTION OF THE DRAWINGS

Figure 1:
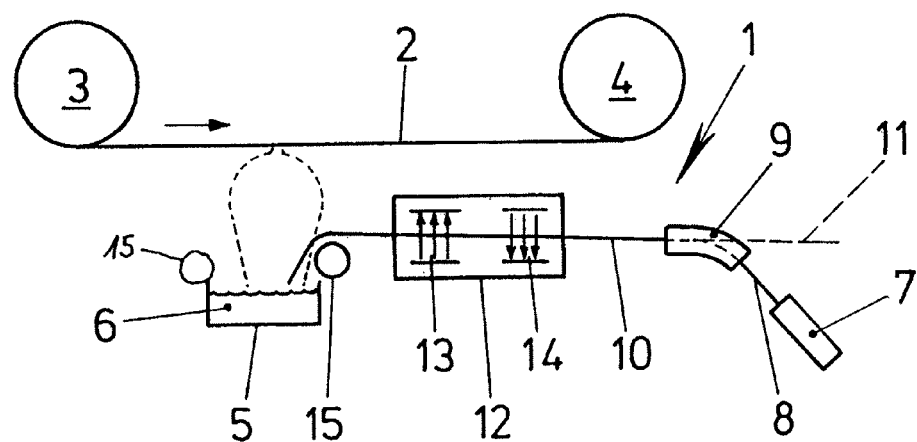
FIG. 1 shows a device for vaporizing a planar substrate, e.g. a foil.

FIG. 1 shows in a schematic representation a device 1 for vapor coating a planar substrate 2, e.g. a foil. The foil is wound off of a first roll 3 onto a second roll 4. In so doing, it is guided over a pot 5 running transverse to the direction of transport. In the pot 5 there is located a melt 6 consisting of the material which is to be vaporized onto the foil. For the melting in and vaporizing of the material, several electron guns 7 are provided, which are disposed next to one another parallel to the pot 5. Each electron gun 7, of which one is represented, is assigned to a certain section of the pot by the corresponding electron beam 8 being guided pendularly over this section using magnetic deflecting units described below.

In the following the electron beam deflection using an electron gun 7 is explained in more detail. Each additional electron gun has a corresponding beam deflection.

The electron gun is aligned so that the electron beam 8 is initially targeted at the substrate 2. However, the electron beam 8 is deflected by a third deflection unit 9 into a plane parallel to the substrate 2, which simultaneously forms a displacement plane 10 in which the beam experiences a pendular parallel displacement with respect to a central axis 11.

The third deflecting unit 9 is of a customary mode of construction and will not be explained in more detail here. As a rule it and the electron gun form one structural unit.

To generate a pendular parallel displacement there is in the displacement plane a first deflecting unit 12 comprising a magnetic field system and two tandemly disposed magnetic fields 13 and 14, which are explained in more detail below. The first magnetic field 13 deflects the electron beam 8 by an angle to the left or to the right in the displacement plane 10. In the second magnetic field 14, this angular displacement is compensated precisely so that the electron beam 8 exits the magnetic field system parallel to its original direction.

In the area of the pot 5 there is a second deflecting unit 15, which deflects the electron beam 8, from the displacement plane 10 into the pot 5, which electron beam 8 would otherwise pass over the pot 5.

Figure 2A:
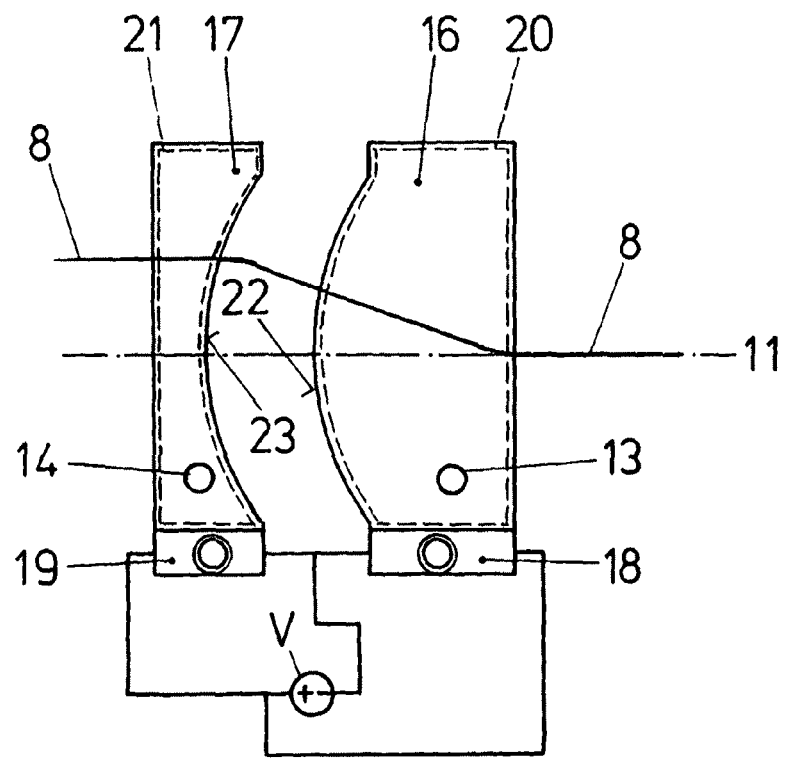
FIG. 2a is a top view of a magnetic deflecting unit which serves for parallel displacement of an electron beam.
Figure 2B:
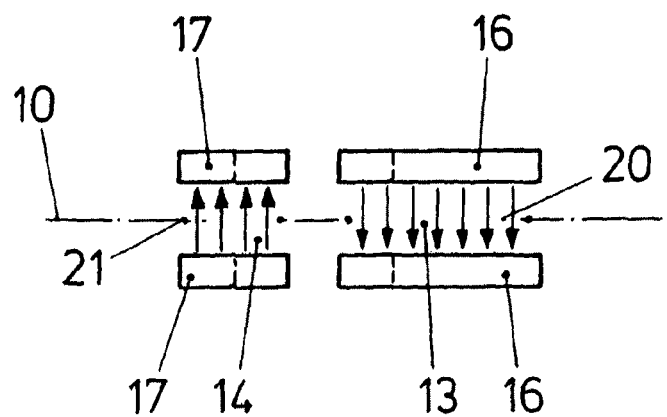

The first deflecting unit 12 is represented in a top view in FIG. 2a and in a side view in FIG. 2b.

The magnetic fields 13 and 14 are generated by two superimposedly disposed, parallel-running armature plates 16 or 17 of an electromagnet 18 or 19, between which the electron beam 8 runs. The direction and intensity of the magnetic fields 13 and 14 are determined by the polarity and intensity of the coil current of the respective electromagnets 18 or 19. Since the magnetic field lines hit the armature plates 16 or 17 at a right angle, the respective magnetic field 13 or 14 bounds the area between the armature plates 16 or 17. The magnetic field boundary 20 or 21, i.e. the envelope of the respective magnet field 13 or 14 relative to a central plane between the armature plates 16 or 17, is thus determined by the shape of the armature plates 16, 17.

The edges of the armature plates 16 of the first magnetic field 13 are straight on the entry side and run perpendicular to the electron beam 8. The electron beam 8 is deflected in the first magnetic field 13 depending on the direction and intensity of the magnetic field 13 to the left or right and exits on the exit side. So that the beam exit is perpendicular to the exit-side tangent to the magnetic field boundary 20, the rear edges 22 of the armature plates 16 of the first magnetic field 13 are shaped convexly.

The armature plates 17 of the second magnetic field 14 are built in a corresponding manner, only their front edges 23 are shaped concavely, so that the entry of the electron beam 8 in each case is also perpendicular to the magnetic field boundary 21. The rear edges of the second magnetic field 14 are once again shaped straight so that also here an exit is perpendicular relative to the magnetic field boundary.

The respective perpendicular entry or exit through the magnetic field boundaries 20 and 21 has the advantage that the electron beam 8 is expanded only slightly or not at all. An exact beam displacement can thus be realized without beam expansion.

With an appropriate choice of the geometric extension of the armature plates 16 and 17 or the number of windings of the coils of the electromagnets 18 and 19 it can be achieved that the compensating beam deflections are each achieved with the same current intensity so that for both magnetic fields 13 and 14 a common voltage source V can be provided, to which they only have to be connected antiparallelly.

As shown in FIG. 1, the displaced electron beam 8 should finally be directed out of the displacement plane 10 into the pot 5. This is achieved according to FIG. 3 by the fact that on a guide tube 24, which runs parallel to the pot 5, several air core coils 25 are fitted close to one another and are numbered (1) to (n) and can be controlled individually. The air core coils form an air core coil row. Only for reasons of comprehensibility are the individual air core coils 25 represented with a small spacing relative to one another. The control of the air core coils 25 is synchronized with the beam displacement so that it is always the case that precisely that air core coil 25 is energized with current in whose section the electron beam 8 runs onto the pot 5.

The magnetic field of an air core coil 25 would not be adequate to deflect the electron beam 8 sufficiently sharply, i.e. by at least 60° to 90°. Therefore, there is in the guide tube 24 a magnetic cylindrical core 26, which is displaceably mounted there with the aid of a magnetic lubricant.

Since the core 26 is magnetized by the respective magnetic field present in an air core coil 25, it is drawn into the air core coil 25 that is currently being energized with current. In the figure this is the air core coil 25 (4). The core 26 therefore moves according to the energizing of the individual coils with current. Since by the core 26 the magnetic field running outside the air core coil 25 is amplified precisely in the area of the respective controlled coil, a sufficiently intense magnetic field is therefore restricted to the section in which the air core coil energized with current is presently located.

Since the dimension of the air core coils 25 is small, in the area of an air core coil 25 it is possible in each case to realize a homogeneous magnetic field which, however, is displaced parallel to the pot according to the coil control. Thus, each electron beam 8 is deflected in the same manner independently of its entry point.

The control of the air core coils 25 (1)-25 (*n*) can be done successively but it can also be done in an overlapping manner so that, to the extent that as the supply of current to an air core coil 25 (*n*) decreases, the following coil 25 (*n*+1) or 25 (*n*−1) is energized with current.

Figure 3:
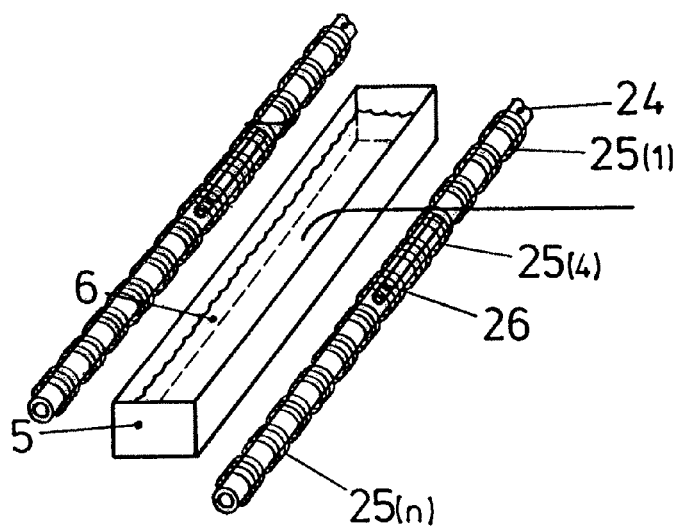
FIG. 3 shows a magnetic deflecting unit with a positionally variable magnetic field.

As FIGS. 1 and 3 show, the second deflecting unit 15 is formed from two air core coil rows extending parallel to the pot 5, where one is disposed in front of the pot 5 and one is disposed behind it. The air core coil rows are set up identically and are synchronous but, in each case, operate with a different and cyclically changing current intensity so that the electron beam is also deflected transverse to the direction of the pot, i.e. is wobbled over the width of the pot 5.

Figure 4:
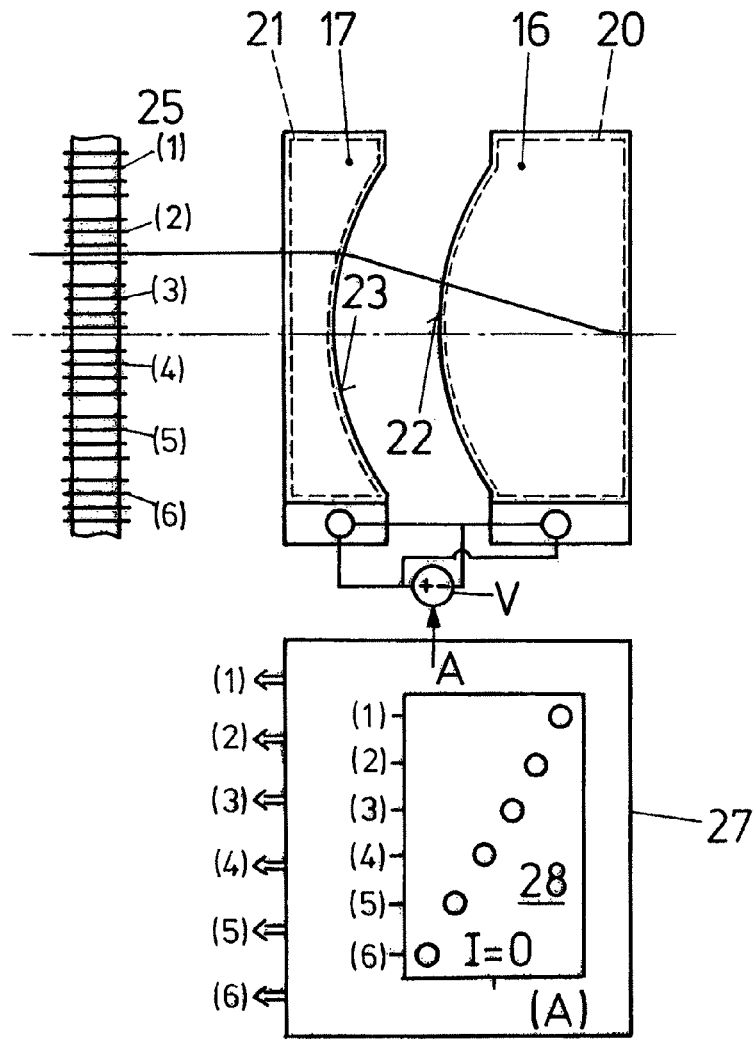
FIG. 4 is a schematic representation of the synchronous control of the deflecting units according to FIGS. 2 and 3.

In FIG. 4 the magnetic deflection system is once again represented schematically. One sees the two armature plates 16 and 17 of the first magnetic deflecting unit and several air core coils 25*n* (n=1, 2 . . . ) of the second deflecting unit 15 for deflecting the electron beam 8 from the displacement plane 10. The control of the magnitude of the displacement, i.e. the intensity of the antiparallel magnetic fields 13 and 14, is coupled to the control of the air core coils 25 (*n*=1, 2, 3 . . . ) in such a manner that the electron beam 8 always runs over an air core coil 25 (*n*) energized with current and due to its magnetic field amplified by the core is deflected from the displacement plane 10. The coupling is accomplished by way of a control 27, in which is stored, e.g. by way of a table 28, a corresponding association between the current intensity A of the coil current for the electromagnets 18 and 19 and the respective air core coil 25*n* to be controlled. Instead of a table an analogous electronic circuit (not represented here) can also be provided.

Figure 5:
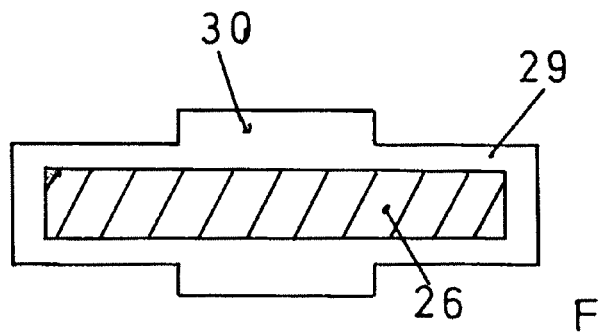
FIG. 5 is a cross-section view through a magnetic core which is needed for the magnetic deflecting unit according to FIG. 3.

If the pot 5 is particularly long then several electron guns are needed, each of which work together with a deflecting system as described above. So that the movement path on the melt surface of one electron beam ends where the movement path of the next electron beam begins, the magnetic core must in each case completely fill up the last two coils of a coil row and, as far as possible, project a bit out of the coil. In order to achieve this, the magnetic core 26 is disposed, as shown in FIG. 5, in a sleeve 29 which has at its center a thickening 30. At the ends of the guide tube, stops for the thickening 30 are provided which do in fact permit one end of the magnetic core 26 to project out of the coil 25 (1) or 25 (*n*), but not to traverse beyond that, and thus reach the center of the magnetic core 26 at the outer edge of the outer air core coil.

| List of Reference Numbers | |
|---|---|
| 1 | Device |
| 2 | Substrate |
| 3 | Roll |
| 4 | Roll |
| 5 | Pot |
| 6 | Melt |
| 7 | Electron beam gun |
| 8 | Electron beam |
| 9 | Third deflecting unit |
| 10 | Displacement plane |
| 11 | Central axis |
| 12 | First deflecting unit |
| 13 | First magnetic field |
| 14 | Second magnetic field |
| 15 | Second deflecting unit |
| 16 | Armature plates |
| 17 | Armature plates |
| 18 | Electromagnet |
| 19 | Electromagnet |
| 20 | Magnetic field boundary |
| 21 | Magnetic field boundary |
| 22 | Edges |
| 23 | Edges |
| 24 | Guide tube |
| 25 | Air core coils |
| 26 | Core |
| 27 | Control |
| 28 | Table |
| 29 | Sleeve |
| 30 | Thickening |

The invention claimed is:

1. A deflecting device for electron beams for use in an electron beam vaporizer, the deflecting device comprising:
    a first magnetic deflecting unit having a central axis, wherein an electron beam entering the first magnetic deflecting unit on the central axis is displaceable parallel to the central axis in a displacement plane via a magnetic field system whose intensity is variable in order to determine a magnitude of the beam displacement;
    a second magnetic deflecting unit operatively configured to direct the electron beam exiting the first magnetic deflecting unit out of the displacement plane;
    wherein the second magnetic deflecting unit generates a magnetic field running transverse to the central axis, a homogeneous area of the magnetic field being shorter than a maximum displacement to be achieved with the first magnetic deflecting unit, wherein a position of the magnetic field running transverse to the central axis is variable synchronously with the beam displacement.

2. The deflecting unit according to claim 1, wherein the second magnetic deflecting unit comprises:
    a plurality of air core coils disposed on one axis, the plurality of air core coils being controllable independently; and
    a magnetic core held displaceably on the one axis.

3. The deflecting device according to claim 2, wherein the second magnetic deflecting unit further comprises:
    a guide tube on which the plurality of air core coils are disposed next to one another; and
    wherein the magnetic core has a cylindrical shape with an outer diameter corresponding approximately to an inner diameter of the guide tube.

4. The deflecting device according to claim 3, wherein the guide tube is a slotted guide tube.

5. The deflecting device according to claim 3, wherein a magnetic liquid lubrication is provided between the magnetic core and the guide tube.

6. The deflecting device according to claim 1, wherein the magnetic field system comprises two tandemly disposed and anti-parallel aligned magnetic fields.

7. The deflecting device according to claim 6, wherein a magnetic field boundary of a first magnetic field runs convexly on an exit side and a magnetic field boundary of a second magnetic field runs concavely on an entry side.

* * * * *